United States Patent [19]
Gupta et al.

[11] Patent Number: 5,807,790
[45] Date of Patent: Sep. 15, 1998

[54] SELECTIVE I-LINE BARL ETCH PROCESS

[75] Inventors: Subash Gupta, San Jose; Christopher F. Lyons, Fremont, both of Calif.

[73] Assignee: Advanced Micro Devices, Inc., Sunnyvale, Calif.

[21] Appl. No.: 848,778

[22] Filed: May 1, 1997

Related U.S. Application Data

[63] Continuation-in-part of Ser. No. 642,845, May 7, 1996, abandoned.

[51] Int. Cl.$^6$ .................................................... H01L 21/00
[52] U.S. Cl. ............................ 438/725; 438/736; 216/49
[58] Field of Search .................... 216/47, 49, 67; 438/710, 719, 725, 736, 732

[56] References Cited

U.S. PATENT DOCUMENTS 5,688,365  11/1997  Ogoshi ..................................... 438/736

FOREIGN PATENT DOCUMENTS

| | | |
|---|---|---|
| 0 123 813 A2 | 7/1984 | European Pat. Off. . |
| 0 123 813 A3 | 7/1984 | European Pat. Off. . |
| 0 573 212 A2 | 8/1993 | European Pat. Off. . |
| WO-A-9412912 | 9/1994 | WIPO . |

OTHER PUBLICATIONS

Patent Abstracts of Japan, vol. 013 No. 253 (P–883), 13 Jun. 1989 & JP,A,01 052142 (Nippon Telegr & Teleph Corp) 28 Feb. 1989.

*Primary Examiner*—William Powell
*Attorney, Agent, or Firm*—Gerald M. Fisher

[57] ABSTRACT

A photolithographic substrate mask patterning method which enables the reduction of changes in critical dimensions which occur in prior art etching of organic photoresist and the underlying organic i-line bottom anti-reflection layer (BARL) on a non-planar substrate. Based on the minor difference in the total carbon and oxygen content between the organic photoresist and the organic BARL, a differential in polarization is achieved using a pure $N_2$ plasma for ion etching at certain selected conditions and a selectivity is achieved between the etch rate of the organic photoresist as compared to the etch rate of the organic BARL.

16 Claims, 4 Drawing Sheets

5,807,790

SELECTIVE I-LINE BARL ETCH PROCESS

This application is a continuation-in-part of application Ser. No. 08/642,845, filed May 7, 1996, now abandoned.

FIELD OF THE INVENTION

This invention relates to photolithographic processes and more particularly to ion-assisted etch processes used in photolithography for patterning semiconductor circuits.

BACKGROUND OF THE INVENTION

The manufacture of semiconductor integrated circuits has been dependent on optical wavelength photolithography from its inception. The requirements for device density has increased continuously and the photolithographic processes have been improved to support each new requirement.

Photolithography, which uses ultraviolet light to pattern photosensitive coatings called photoresists (PR) on semiconductor wafer surfaces, is now being pressed to resolve features close to and even smaller than the wavelength of the ultraviolet light. Current photolithography production equipment, called i-line steppers, use a UV source having a wavelength of 0.365 microns. The critical dimension (CD) on the latest production of integrated circuits is 0.350 microns. Accordingly, the i-line stepper equipment is at the limit of its capability. Because of the vast investment in this technology and in this equipment, every possible effort is being expended to extend the life of i-line photolithography.

In the patterning of PR, it is important to project a clearly focused image with high depth of field at the surface of the PR. However, since the surface of an integrated circuit is not exactly planar, reflections of the patterning light rays from underlying topology degrade the projected image.

It is known to use an anti-reflection coating layer below the photoresist to absorb the light which passes through the PR to reduce the interfering reflections. This lower anti-reflection layer is being called the i-line bottom anti-reflection layer or i-line BARL.

Although i-line BARL has been of great value in reducing reflections, in those instances where the surface is substantially non-planar as illustrated in FIG. 1, when the i-line BARL layer is spun onto the wafer, it flows into and fills the low areas and remains thicker in those lower regions. After forming the PR pattern in subsequent processing steps, it is necessary to expose regions of the underlying surface of the substrate. To accomplish this requires removal of the i-line BARL layer in the regions not protected by PR. When the i-line BARL layer overlying the substrate regions to be exposed is removed by the standard prior art plasma etch formulation, severe etching occurs of the patterned photoresist, as illustrated at element 4' in FIG. 2, an area which is not supposed to be removed during etching. Accordingly, the change in CD's is made even greater by the need to etch through the thicker i-line BARL layer overlying the low lying areas of the topology. The effect of this prior art etching of the PR is that the CD's of the PR pattern are altered. Accordingly, there is a need to provide a photolithography process which maintains resist profiles during plasma removal of spin-on organic i-line BARL material.

SUMMARY OF THE INVENTION

It is the object of the invention to achieve i-line BARL etch without detriment to the critical dimension.

It is a further object of the invention to achieve a selective i-line BARL etch rate vis-a-vis PR etch rate.

It is a feature of the invention that selective reactive ion etch of the PR and i-line BARL layer are carried out using nitrogen as the reactive species.

It is a still further feature that improved selective ion etch can be achieved using reactive nitrogen mixed with one or more temperature enhancing inert gases for PR and i-line BARL layers.

DETAILED DESCRIPTION OF THE INVENTION

Figure 1:
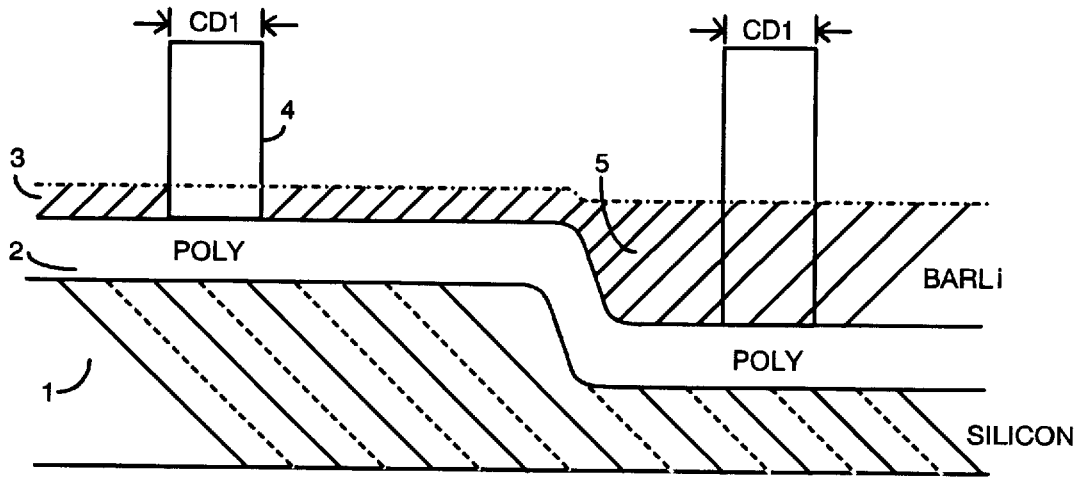
FIG. 1 illustrates the cross section of a silicon wafer with layers during manufacture of an integrated circuit.

With reference to FIG. 1, it can be seen that the i-line BARL layer 5 underlies the photoresist layer 4 and that the i-line BARL layer fills in the lower regions in the surface topology such as region 5 when the i-line BARL layer is spun on. The thickness of the i-line BARL layer is exaggerated in FIG. 1 for illustrative purposes. Even at the thickest, the i-line BARL layer is less than half the PR layer thickness.

Figure 2:
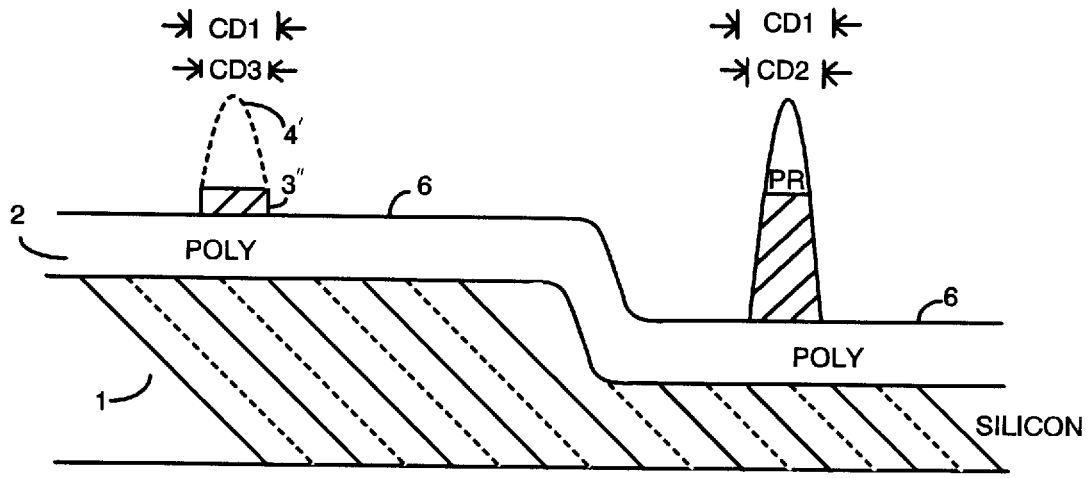
FIG. 2 is an illustration of the cross section of a silicon wafer surface after standard PR and i-line BARL etch as in Prior Art.

Assume for explanatory purposes that FIG. 1 represents the cross section after the photoresist has been patterned by exposure to UV and after the pattern development of the photoresist layer has been completed but before the exposed i-line BARL layer regions (3 and 5) underlying the PR layer has been removed to expose selected underlying substrate regions. Because of the non-planar topology of the underlying surfaces, the i-line BARL layer will exhibit substantial local thickness variation. As seen in FIG. 2, when the standard PR etch process using oxygen plasma usually with freon ($CHF_3$) and argon (Ar) additives is continued until the underlying poly layer 6 is completely exposed, significant removal of the masking PR 4 and i-line BARL 3 are also removed resulting in undesirable change in the critical dimension established after PR development.

The BARLI material used is a commercially available product from Hoechst called AZ BARLI coating. The photoresist used was SPR508 photoresist by Shipley. We have studied the chemical differences between the photoresist material and the BARLI material, and have found that the BARLI material has a substantially higher oxygen content than the photoresist.

Figure 4A:
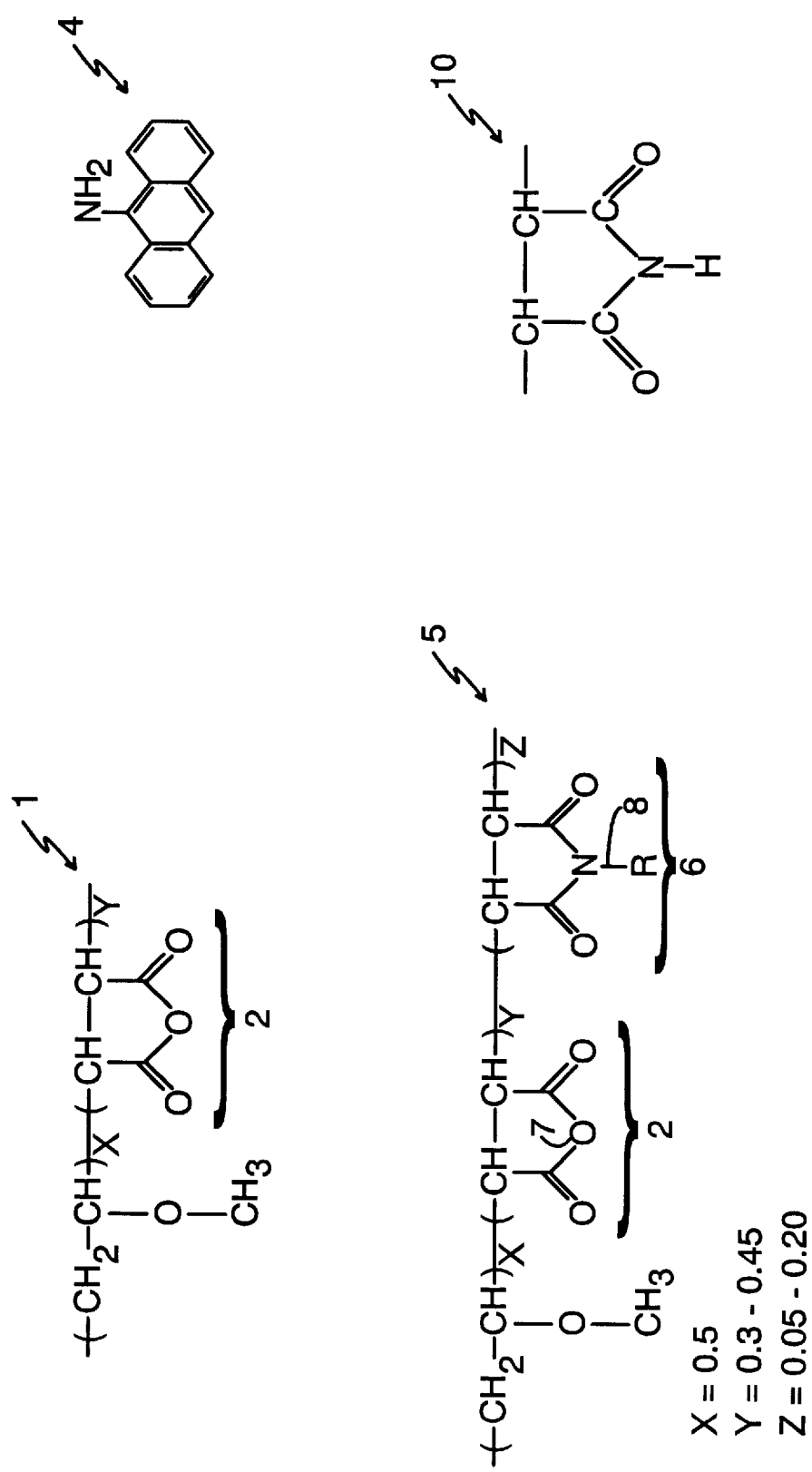
FIG. 4A illustrates the polymer structure of AZ BARLI material.

The chemical structures of the two materials are depicted in FIG's 4A and 4B. FIG. 4A shows the polymer backbone of the BARLI material. The polymer backbone 1 of the BARLI material comprises poly (vinyl methylether-comaleic anhydride), which contains polymerized maleic anhydride units 2. Anthracene units 4 are incorporated by chemical bonding to the polymer backbone. The resulting polymer structure 5 contains not only a fraction Y of the maleic anhydride units 2, but additionally a fraction Z of substituted maleic anhydride units 6, where the central oxygen atom 7 has been replaced by anthracene unit 8, represented by N-R. These substituted maleic anhydride units 6 are also termed "substituted maleimide units," or "maleimide-like units," due to their similarity to polymerized maleimide structures 10, wherein the N-H of the maleimide unit has anthracene N-R substituted therefor. The details of the chemical structure and the method of making of the AZ BARLI material are described by Fahey, et al., in "Design of a Bottom Anti-Reflective Layer for Optical Lithography," Proceedings of International Society for Optical Engineering, 28 Feb./1 Mar. 1994, 2195, SPIE, pp. 422–446, which is hereby incorporated by reference.

Figure 4B:
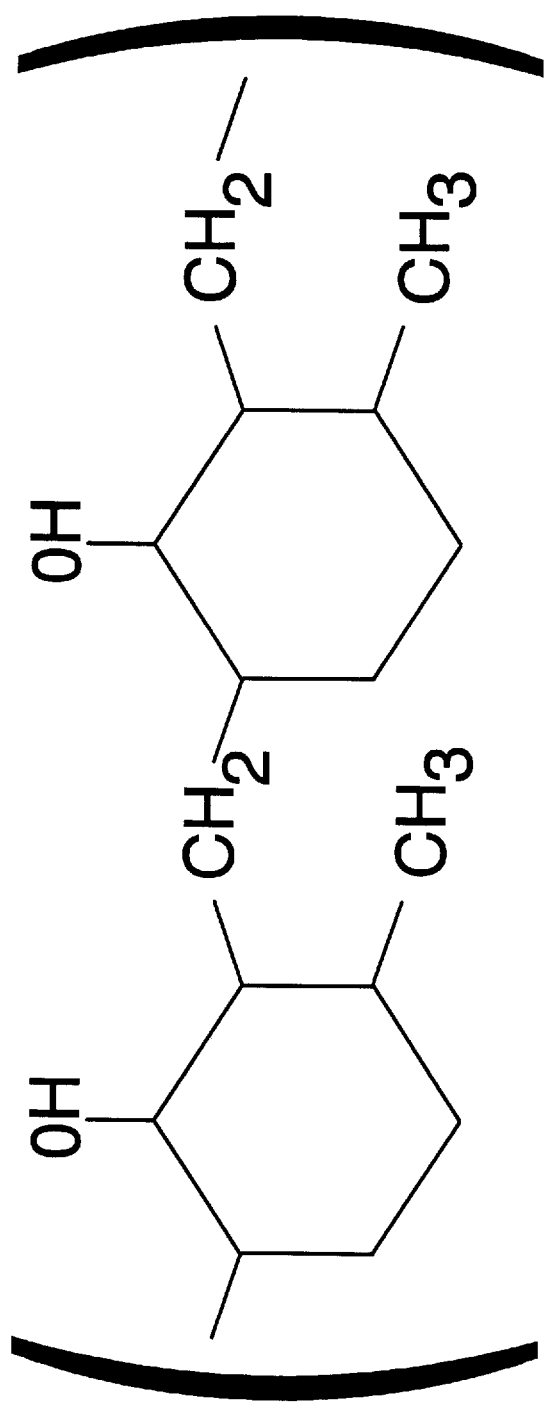
FIG. 4B illustrates the polymer structure of Shipley SPR 508 photoresist.

According to the range of values given for Y and Z by Fahey, et al., in the aforementioned reference, the minimum oxygen content of the BARLI polymer backbone is approximately 39.8%. In contrast, the oxygen content of the polymer backbone of the Shipley photoresist, depicted in FIG. 4B, is approximately 13.3%.

This value is characteristic of the oxygen contents of other commercially available organic photoresists. Our efforts have been directed to finding a way to selectively etch the i-line BARL layer, and to remove the i-line BARL layer without significant removal of the remaining photoresist.

We reasoned that the i-line BARL layer might be made to become more polarized than the PR because of the higher concentration of oxygen atoms in the i-line BARL material. Then, we reasoned that we would provide an ion-assisted etch process which would react faster with the more polarized material because its bonds would then be more vulnerable. Accordingly, we sought a means of selectively polarizing the i-line BARL material. We have discovered that a plasma using pure nitrogen provides an etch selectivity i-line BARL/PR of 1.6 employing an excitation of 13.56 MHZ radio frequency at greater than 50 watts and a sheath self bias of 100–150 volts. The chamber pressure was 15–50 mTorr and the nitrogen flow rate was 20–50 SCCM. We used the Model 5000 manufactured by Applied Materials, Inc. for our experiments. Magnetic field enhancement mode improves the etch profile. The chamber pressure should be greater than 0.5 mTorr and less than 2 Torr and the partial pressures of $O_2$ and fluorocarbon compounds should be less than 10 mTorr.

Figure 3:
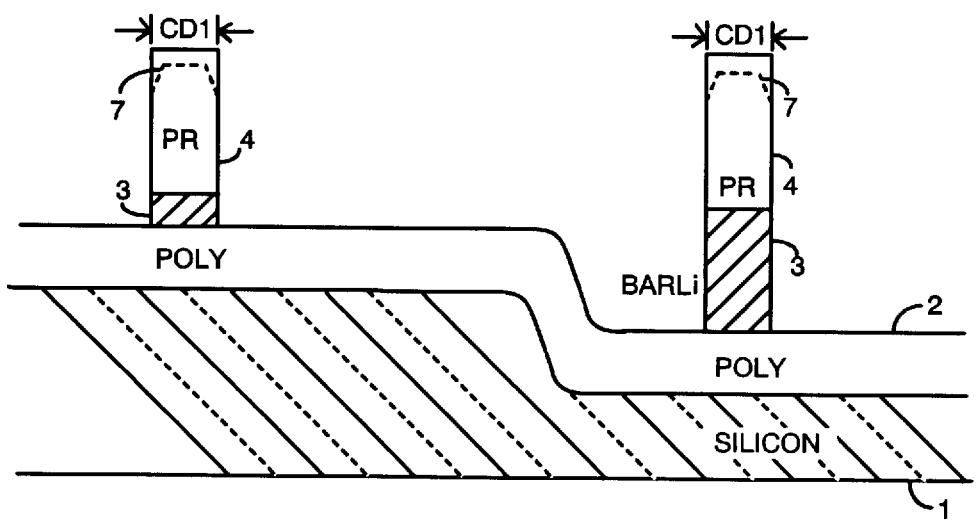
FIG. 3 is illustrative of the cross section of a silicon wafer surface after using the process of this invention.

We believe the nitrogen plasma provides both chemi-absorption and topical heating to volatilize the reaction products. We have also discovered that the etch rate selectivity can be further improved by adding to the $N_2$ plasma an inert gas or mixture of gases. With a nitrogen and argon mixture ($N_2$/Ar=50/10 SCCM) we have improved the selectivity to 2.2. However, we have noted that when using argon the PR can heat up and melt unless the plasma is cooled by some means such as by duty cycle reductions by switching the plasma on and off, controlling the bias potential and/or adding other lighter inert additive gases. We believe that neon or helium with nitrogen will be successful with or without argon since they are much lighter weight molecules than argon and will provide sufficient but more gentle directional topical heating to volatilize the reaction products $C_2N_2$, HCN, CO, $CO_2$, etc. without melting of the PR. We have noted that the good etching directionality is maintained in that the vertical removal rate is maintained while the lateral etch rate is minimal. As seen in FIG. 3, in connection with the cross section of the wafer surface after use of our invention, we note that the critical dimension (CD) is maintained and that the vertical sides of the PR 4 are maintained except for a small degree of faceting of the PR top edges.

We believe that any machine capable of supporting ion-assisted etching should be able to carry out this method including other hardware for creating a plasma such as a diode, or triode, MERIE and ECR. It is our intention to further refine our process and it is not our intention that our invention is to be restricted to the specific embodiments disclosed. For purposes of construing the scope of our invention, the claims shall control. With this in view,

What is claimed is:

1. A photolithography substrate mask patterning method comprising:

(a) applying an organic i-line bottom anti-reflection layer (BARL) material on top of a surface of a substrate to be patterned;

(b) applying an organic photoresist layer directly in contact and on top of said i-line BARL material, said BARL and organic photoresist layers being a layered surface on said substrate, where said BARL has a higher total oxygen content than said organic photoresist layer;

(c) exposing said photoresist layer to an UV light pattern and developing a pattern in said photoresist by removing portions and leaving remaining portions of said photoresist;

(d) introducing said substrate to a vacuum chamber and reducing the pressure in said vacuum chamber with a vacuum pump such that in the vicinity of the top of said substrate the base partial pressure of any present fluorocarbon compounds and $O_2$ in said chamber are both less than 1 mTorr prior to introduction of plasma sustaining gases;

(e) inducing an excited plasma in said vacuum chamber and providing a continuous flow of plasma sustaining gas including $N_2$ flow as the primary plasma sustaining gas, where said chamber pressure is greater than 0.5 mTorr and less than 2 Torr and where the plasma sustaining gas may also include $O_2$ or fluorocarbon compound, and where the partial pressures of either said $O_2$ gaseous fluorocarbon compound gases in said chamber is below 10 mTorr, said excited plasma having a sheath potential; and (f) ion etching said organic BARL and said remaining portions of said organic photoresist layer by treating said layered surface of said substrate with said excited plasma, where said layered surface is bombarded with ions having energy, including controlling the temperature of said layered surface of said substrate during step (f), wherein said step of controlling the temperature of said layered substrate surface comprises adding a temperature controlling gas as an additive to said plasma sustaining gas.

2. The method of claim 1, wherein said i-line BARL material includes maleimide-like units.

3. The method of claim 1 wherein said temperature controlling gas is an inert gas or mixture of inert gases.

4. The method of claim 3 wherein said inert gases include argon.

5. The method of claim 4 wherein argon is included in said temperature controlling gas and the plasma sheath potential is controlled to provide adjustment of said energy of said ion bombardment.

6. The method of claim 5 wherein said UV light has a wavelength of 0.365 microns.

7. The method of claim 1 wherein said ion etch is sustained by a 13.56 MHz radio frequency source at a power level in excess of 25 watts.

8. The method of claim 5 wherein said plasma sheath potential is less than 300 volts.

9. The method of claim 1 wherein the step of etching is magnetically enhanced and said etching step is ion assisted.

10. The method of claim 1 wherein said nitrogen flow rate is greater than 50 SCCM.

11. The method of claim 1 wherein said temperature controlling gas includes a gas selected from the group consisting of neon and helium.

12. The method of claim 1 wherein said temperature controlling gas includes neon.

13. The method of claim 3 wherein said inert gases include helium.

14. The method of claim 1 wherein the total pressure in said vacuum chamber is more than 10 mTorr and less than 50 mTorr and the plasma is excited at 13.56 MHz.

15. The method of claim 14 wherein the $N_2$ flow rate is between 20 and 50 SCCM.

16. The method of claim 1 wherein the $N_2$ flow rate is between 20 and 50 SCCM.

* * * * *